(12) United States Patent
Kono et al.

(10) Patent No.: US 6,320,810 B1
(45) Date of Patent: Nov. 20, 2001

(54) SEMICONDUCTOR MEMORY DEVICE ALLOWING REDUCTION IN CURRENT CONSUMPTION

(75) Inventors: Takashi Kono; Katsuyoshi Mitsui, both of Hyogo (JP)

(73) Assignee: Mitsubishiki Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/659,832

(22) Filed: Sep. 11, 2000

(30) Foreign Application Priority Data

Sep. 16, 1999 (JP) ................................. 11-261835P

(51) Int. Cl.[7] ........................................... G11C 7/00
(52) U.S. Cl. ............... 365/226; 365/189.11; 365/189.09; 365/230.06
(58) Field of Search .................................... 365/226, 222, 365/189.11, 189.09, 205, 207, 230.06, 229; 327/541, 546

(56) References Cited

U.S. PATENT DOCUMENTS 5,249,155 * 9/1993 Arimoto et al. ..................... 365/222

6,184,744 * 2/2001 Morishita ............................ 327/541

FOREIGN PATENT DOCUMENTS 62-5422   1/1987   (JP) .

* cited by examiner

*Primary Examiner*—David Nelms
*Assistant Examiner*—David Lam
(74) *Attorney, Agent, or Firm*—McDermott, Will & Emery

(57) ABSTRACT

A through-current Ic of a comparator circuit is switched in accordance with a response speed required with respect to a current consumption. Additionally, a through-current Is of a shifter circuit, which sends to the comparator circuit an output signal at an appropriate level transmitting a difference between an internal power supply potential Vdd and a reference potential Vref is switched according to the required response speed. When a device is in a standby state requiring a small current consumption in internal power supply potential Vdd, both through-currents Ic and Is are set small so that the whole current consumption can be further reduced.

10 Claims, 13 Drawing Sheets

SEMICONDUCTOR MEMORY DEVICE ALLOWING REDUCTION IN CURRENT CONSUMPTION

BACKGROUND OF THE INVENTION

1. Field of the Invention

The present invention relates to a semiconductor device, and particularly, a semiconductor device including a Voltage Down Converter (VDC).

2. Description of the Background Art

External power supply potentials ext.Vdd supplied to semiconductor chips have been lowered in accordance with demands for reduction in power consumption of systems employing the chips. Although the external power supply potential ext.Vdd has been lowered, problems relating to reliability and others may practically occur if the external power supply potential is used as an operation power supply potential of transistors within the chip without converting it. In view of this, an internal power supply potential Vdd lower than external power supply potential ext.Vdd is generally generated within the chip for using it as the operation power supply potential of transistors.

FIG. 12 is a block diagram showing a structure of a synchronous dynamic random access memory (SDRAM) 501, which is an example of a conventional semiconductor chip.

Referring to FIG. 12, SDRAM 501 includes four banks, which have a total storage capacity of 256 megabits and can operate independently of each other. In SDRAM 501, read/write operations are performed in synchronization with a clock signal CLK which is externally supplied thereto. For performing an intended operation, a command determined by a combination of control signals /RAS, /CAS and /WE is applied thereto. Also, SDRAM 501 is externally supplied with appropriate or necessary signals such as a control signal /CS instructing chip selection as well as a control signal CKE instructing whether clock signal CLK is to be taken into SDRAM 501 or not.

SDRAM 501 further includes a power supply potential generating circuit 510 which is externally supplied with an external power supply potential ext.Vdd, and issues an internal power supply potential Vdd after lowering the voltage. Power supply potential generating circuit 510 includes a VDC control circuit 532 which receives row-related bank activating signals from row decoders and word drivers 10#0–10#3 provided corresponding to the respective memory array banks, and issues signals ICL, ICM and ICS, a Vref generating circuit 534 which generates a reference potential Vref, and a voltage down converter (VDC) 536 which receives reference potential Vref, and issues power supply potential Vdd by lowering external power supply potential ext.Vdd to the same level as reference potential Vref at a response speed corresponding to signals ICL, ICM and ICS.

VDC control circuit 532 issues signals ICL, ICM and ICS based on the active state of the bank and the command. VDC 536 operates with a response speed controlled by signals ICL, ICM and ICS, and supplies a current from a node supplied with external power supply potential ext.Vdd to a node issuing internal power supply potential Vdd so that internal power supply potential Vdd may be equal to reference potential Vref.

FIG. 13 is a circuit diagram showing a structure of VDC 536 shown in FIG. 12.

Referring to FIG. 13, VDC 536 includes a shifter circuit 602 which receives reference potential Vref and internal power supply potential Vdd, and shifts the input level, a comparator 604 which receives signals REF and SIG issued from shifter circuit 602, and makes a comparison between them, and a driver 606 which operates in accordance with the output of comparator 604 to supply a current from the node supplied with external power supply potential ext.Vdd to the node issuing internal power supply potential Vdd.

Shifter circuit 602 includes an NOR circuit 612 which receives a signal ACT and a signal CKEI, a P-channel MOS transistor 618 which is connected between a node receiving external power supply potential ext.Vdd and a node N61, and receives on its gate the output of NOR circuit 612, an N-channel MOS transistor 620 which is connected between nodes N61 and N62, and receives reference potential Vref on its gate, an N-channel MOS transistor 622 which is connected between node N62 and a ground node, and has a gate connected to a node N63, an N-channel MOS transistor 624 which is connected between nodes N61 and N63, and receives internal power supply potential Vdd on its gate, and an N-channel MOS transistor 626 which has a gate and a drain connected to node N63, and also has a source connected to the ground node. A signal REF is issued from node N62 of shifter circuit 602, and a signal SIG is issued from node N63.

Comparator 604 includes a P-channel MOS transistor 628 which is connected between a node supplied with external power supply potential ext.Vdd and node N64, and has a gate connected to a node N65, an N-channel MOS transistor 630 which is connected between nodes N64 and N66, and has a gate receiving signal REF, a P-channel MOS transistor 632 which has a source coupled to external power supply potential ext.Vdd, and has a gate and a drain connected to a node N65, an N-channel MOS transistor 634 which is connected between nodes N65 and N66, and has a gate receiving signal SIG, and N-channel MOS transistors 636, 638 and 640 which are connected in parallel between node N66 and the ground node, and have gates receiving ICL, ICM and ICS, respectively.

Comparator 604 issues from its node N64 a signal DO for controlling a current supplied from the driver.

Driver 606 includes a P-channel MOS transistor 642 which is connected between a node supplied with external power supply potential ext.Vdd and a node issuing internal power supply potential Vdd, and has a gate receiving signal DO.

Typical operation specifications of the SDRAM are called "PC100", and the following description will be given by way of example on an SDRAM conforming the PC100.

FIG. 14 is an operation waveform diagram showing waveforms of external signals in the write operation of SDRAM 501.

Referring to FIG. 14, these waveforms show an operation in the case where each of a RAS-CAS delay time tRCD and a row precharge time tRP is equal to 3 cycles, and a burst length BL is 4.

At time t1 and therefore at a rising edge of clock signal CLK, the device is supplied with a command ACT[0] activating row-related portions in bank 0. The command is supplied together with a bank address, and a number inside square brackets following each command represents the bank address.

A combination of signals A0–A12 is applied as a row address X for selecting one word line WL, and at the same time, a combination of signals BA0 and BA1 is applied as a bank address which designates bank 0.

At time t4 after three cycles, a command WRITE[0] for performing writing on word line WL, which is already active, is supplied in response to the rising edge of clock signal CLK. At the same time, column address Y formed of a combination of signals A0–A9 is applied, and the bank address is also applied. Command WRITE is determined by the combination of control signals /CS, /RAS, /CAS and /WE. For four cycles from time t4 to time t7, write data D0–D3 are applied in accordance with a combination of externally applied signals DQ0–DQ15, and are written into the memory cells.

At time t8, a command PRE[0] for resetting word lines WL in active bank 0 is externally supplied to the device. Command PRE is applied as a combination of control signals /CS, /RAS, /CAS and /WE. For reliably writing the data into the memory cells, a time tWR must be kept between writing of last data D3 and subsequent input of command PRE[0]. In the foregoing manner, the data can be written into a specific bank.

When the same bank is to be accessed subsequently, a time equal to row precharge time tRP or more is required before starting the access.

When the operation shown in FIG. 14 is performed, a current consumption with internal power supply potential Vdd of the SDRAM varies with time.

FIG. 15 is a schematic waveform diagram showing changes in current consumption.

In one row cycle shown in FIG. 15, i.e., in the cycle during which commands ACT, WRITE and PRE are executed, a current consumption with power supply potential Vdd starts to increase rapidly upon input of each command. Since the SDRAM performs fast reading and writing, the peak value and average value of the current consumption are very large during the reading and writing.

The current consumption is small for a period from time t2 to time t3 and a period from time t4 and time t5, and in other words, for periods Trs1 and Trs2 from completion of predetermined operations to input of next commands. In general, each of periods indicated by Trs1 and Trs2 is call an "active standby period". The active standby state is such a state that the row-related portions are already active, the column-related operations can be performed, and nevertheless the current consumption can be suppressed while keeping such a state.

The standby state of the SDRAM during the foregoing active standby period is different from that of the SDRAM during a so-called standby period, for which none of the row-related portions is active. Current consumption Ias in the active standby state is larger than current consumption Iss in the standby state because the row related portions are active in the active standby state. These consumed current Ias and Iss include the through current in comparator 604, which becomes one of the most dominant factors in some case.

For handling variations in current consumption with power supply potential Vdd, and suppressing the through-current in comparator during standby state to reduce total value of standby current, it is necessary to devise the control of VDC generating power supply potential Vdd.

As already described with reference to FIG. 13, VDC 536 is formed of the comparator and the driver. The operation speed of the comparator increases or decreases in accordance with a through-current flowing through the comparator, and it is preferable that this through-current is small during the standby period and the active standby period. In accordance with the current consumed with the power supply, therefore, the value of this through-current is switched by changing signals ICL, ICM and ICS which are issued from VDC control circuit 532.

Description will now be given on signals ICL, ICM and ICS issued from VDC control circuit 532. In comparator 604 shown in FIG. 13, a value of through-current Ic is restricted by N-channel MOS transistors 636, 638 and 640. Signal ICL is activated when the consumption of power supply current is large, and therefore increases the value of through-current. Signal ICM is active when the row-related circuits are active, and N-channel MOS transistor 638 determines the value of standby current during the active standby period. Signal ICS is active during the standby period, and N-channel MOS transistor 640 determines through-current Ic during standby.

In FIG. 15, therefore, signal ICS attains H-level, and signals ICL and ICM attain L-level during the standby periods before time t1 and after time t6.

When the current consumption value is large during periods between times t1 and t2, t3 and t4, and t5 and t6, both signals ICL and ICM are set to H-level, and through-current Ic goes to the maximum value.

During the active standby periods, e.g., between times t2 and t3, and t4 and t5, signal ICM is set to H-level, and signals ICL and ICS are set to L-level. In this state, the through-current slightly exceeds the through-current during the standby period.

Referring to FIG. 13 again, description will now be given on the operation of shifter circuit 602 and the relationship of control signals ICL, ICM and ICS with respect to through-current Ic.

In VDC 536 shown in FIG. 13, comparator 604 is not configured to receive reference potential Vref and internal power supply potential Vdd. Comparator 604 receives signals SIG and REF, which are the outputs of shifter circuit 602. Shifter circuit 602 receives reference potential Vref and internal power supply potential Vdd, and changes the levels thereof for issuing signals SIG and REF. The levels of signals SIG and REF can be approximately expressed by the following formulas:

$$SIG = (½) \times Vdd \qquad (1)$$

$$REF = Vref - (½) \times Vdd \qquad (2)$$

In these formulas, it is assumed that all the transistors forming the shifter circuit has equal sizes, and the substrate bias effect can be ignored. As can be seen from the formulas (1) and (2), the level conversion of signals SIG and REF is stably performed without an influence by external power supply potential ext.Vdd and process variations, and signals SIG and REF change in opposite direction with respect to each other.

Signals SIG and REF changes around centers which are approximately defined by half the levels of reference potential Vref and internal power supply potential Vdd, respectively. Therefore, N-channel MOS transistors 634 and 630 in the comparator receiving these signals can operate in saturated regions even if a potential Vc on a node N66 is close to the ground potential.

Since potential Vc on node N66 determines the lower limit of the amplitude of output signal DO of comparator 604, this lower limit can be relatively reduced by providing shifter circuit 602.

If this lower limit can be lowered, gate-source potential Vgs of P-channel MOS transistor 642 in driver 606 can be increased so that driver 606 can be effectively used. In other words, a voltage down converter having a sufficient current supply capacity can be achieved even if the transistor size of P-channel MOS transistor 642 is relatively small.

Additionally, since the comparator input acts in opposite direction, the response of signal DO can be advantageously high. Further, the transistor size in the driver can be reduced, the response does not lower even when through-current Ic of comparator 604 is suppressed. Since the transistors forming shifter circuit 602 have small sizes, it is possible to ignore increase in layout area caused by the shifter circuit.

As already described, the through-current is switched among three N-channel MOS transistors 636, 638 and 640 receiving respective signals ICL, ICM and ICS for making the setting to reduce through-current Ic of comparator 604 during standby. Assuming that N-channel MOS transistors 636, 638 and 640 have constants β of values β636, β638 and β640, respectively, there is a relationship of (β636>β638>β640). Constant β can be expressed by the following formula:

$$\beta = (W/L) \times \mu \times C_{OX} \quad (3)$$

where W is a channel width of the transistor, L is a channel length of transistor, $\mu$ is an average surface mobility and $C_{OX}$ is a gate capacity per unit area.

In general, when the VDC including the shifter circuit is operating, through-current Ic of the comparator and through-current Is of the shifter circuit form a stationary current consumption of the VDC.

It is assumed that each of N-channel MOS transistors 630 and 634 has a constant β of a value of βc, and each of N-channel MOS transistors 620 and 624 has a constant β of a value of βs. When it can be considered that potential Vc is substantially equal to the ground voltage, Vgs of each of N-channel MOS transistors 630 and 634 is approximately equal to Vgs of each of N-channel MOS transistors 620 and 624. Therefore, a relationship expressed by the following formula is established between through-currents Ic and Is in VDC 536 shown in FIG. 13.

$$Ic = (\beta c / \beta s) \times Is \quad (4)$$

Through-current Is is determined to be smaller than through-current Ic. However, excessively small through-current Is increases a delay time in the shifter circuit, i.e., the time required for charging/discharging the gate capacity of N-channel MOS transistor 630 when internal power supply potential Vdd changes. Therefore, βc/βs is set to about 10 at most.

It can be considered that through-current Ic determined by the formula (4) corresponds to the state where both signals ICL and ICM in FIG. 13 are at H-level. In this case, the current consumption in VDC is determined primarily by through-current Ic of the comparator, and through-current Is of the shifter circuit can be ignored.

In the case other than the above, through-current Ic of comparator 604 is restricted, and is smaller than that in the foregoing case. For example, when clock enable signal CKE is deactivated, portions such as a clock buffer consuming a large amount of power supply current are deactivated so that the whole consumption of the power supply current becomes very small.

In this case, only signal ICS is activated, and signals ICL and ICM are deactivated. Thereby, only N-channel MOS transistor 640 of the smallest size is turned on so that through-current Ic of the comparator is extremely suppressed. In this case, through-current Ic of the comparator can be nearly equal to through-current Is of the shifter circuit.

In the above active standby state, it is desired to reduce exhaustively the current consumption, and the through-current in VDC forms one of unignorable factors. However, through-current Is of the shifter circuit which is similar in magnitude to through-current Ic of the comparator is unavoidably present so that the whole current consumption of the chip cannot be suppressed to a large extent.

SUMMARY OF THE INVENTION

An object of the invention is to provide a semiconductor device which includes a voltage down converter provided with a shifter circuit, and particularly a semiconductor device in which a through-current of the shifter circuit is controlled in accordance with the operation of a load circuit to suppress a delay by the shifter circuit during operation of the load circuit, and to reduce the through-current of the shifter circuit during standby of the load circuit, and thereby a whole current consumption is reduced.

In summary, the invention provides a semiconductor device including a power supply circuit.

The power supply circuit receives an externally supplied external power supply potential, supplies a power supply current to a load circuit connected to an internal power supply node, and controls an amount of the power supply current at a response speed corresponding to externally applied setting such that the potential on the internal power supply node is held at a constant potential. The power supply circuit includes a reference potential generating circuit for generating a reference potential used as a reference value of the constant potential, a control circuit for receiving the setting, a level shifter circuit for shifting levels of the potential on the internal power supply node and the reference potential into predetermined potential ranges at the response speed corresponding to the output of the control circuit, and issuing the level-shifted potentials, a first drive circuit having an input range of the predetermined potential range, and operating in accordance with the output of the level shifter circuit, and a second drive circuit for receiving the external power supply potential, and supplying the power supply current of the amount corresponding to the output of the first drive circuit to the internal power supply node.

Accordingly, a major advantage of the invention is that the response speed of the shifter circuit is finely controlled in accordance with an appropriate internal signal, and thereby the current consumption of the power supply circuit and therefore the whole current consumption of the semiconductor device can be optimized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers or characters.

The following description will be given by way of example on a voltage down converter in an SDRAM of a four-bank structure. Naturally, the invention can be applied to SDRAMs having banks less or more than four.

[First Embodiment]

Figure 1:
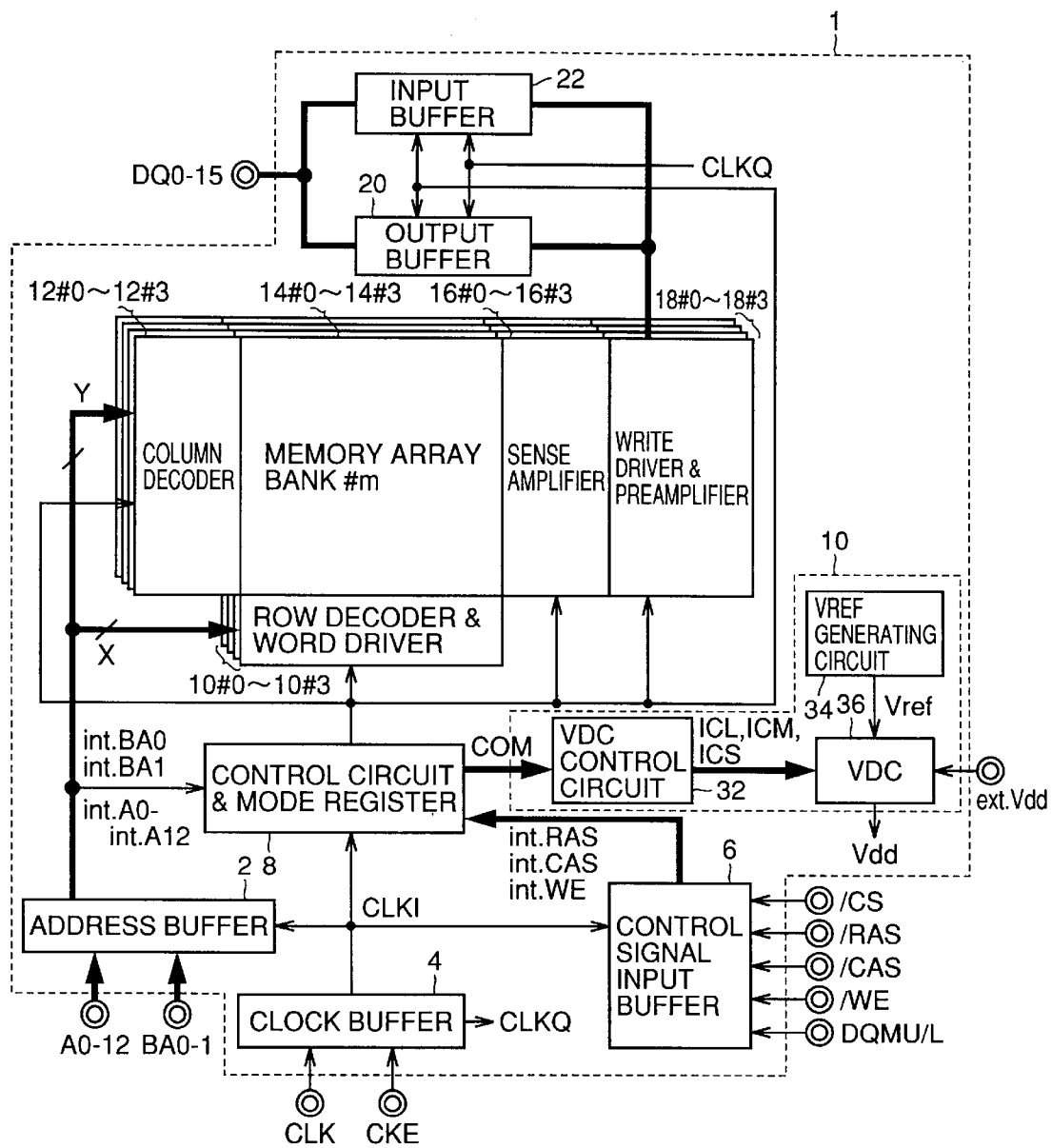
FIG. 1 is a schematic block diagram showing a structure of a semiconductor memory device 1 of a first embodiment of the invention.

FIG. 1 is a schematic block diagram showing a structure of a semiconductor memory device 1 of a first embodiment of the invention.

Referring to FIG. 1, semiconductor memory device 1 includes a memory array banks 14#0–14#3 each having a plurality of memory cells arranged in rows and columns, an address buffer 2 which takes in externally applied address signals A0–A12 and bank address signals BA0–BA1 in synchronization with a clock signal CLKI, and issues internal row addresses, internal column addresses and internal bank addresses, a clock buffer 4 which is externally supplied with a clock signal CLK and a clock enable signal CKE, and issues clock signals CLKI and CLKQ to be used within the semiconductor memory device, and a control signal input buffer 6 which takes in externally applied control signals /CS, /RAS, /CAS and /WE and an externally applied mask signal DQMU/L in synchronization with clock signal CLKI.

Semiconductor memory device 1 further includes a control circuit which receives internal address signals int.A0–int.A12 and internal bank address signals int.BA0 and int.BA1 sent from address buffer 2 as well as control signals int.RAS, int.CAS and int.WE, which are sent from control signal input buffer 6 and are synchronized with the clock signal, and issues control signals to the respective blocks in synchronization with clock signal CLKI, and a mode register which holds the operation mode recognized by the control circuit. In FIG. 1, the control circuit and the mode register are depicted as one block 8.

The control circuit includes a bank address decoder for decoding internal bank address signals int.BA0 and int.BA1, and a command decoder for receiving and decoding control signals int.RAS, int.CAS and int.WE.

Semiconductor memory device 1 further includes row decoders which are provided corresponding to memory array banks 14#0–14#3 for decoding row address signals X sent from address buffer 2, respectively, and word drivers for driving address-designated rows (word lines) in memory array banks 14#0–14#3 to the selected state in accordance with the output signal of the row decoders, respectively. In FIG. 1, each row decoder and the corresponding word driver are depicted as a single block, and these blocks are indicated by 10#0–10#3, respectively.

Semiconductor memory device 1 further includes column decoders 12#0–12#3 for decoding internal column address signals Y sent from address buffer 2, and issuing column select signals, respectively, and sense amplifiers 16#0–16#3 which sense and amplify data of the memory cells connected to the selected rows in memory array banks 14#0–14#3, respectively.

The semiconductor memory device 1 further includes an input buffer 22 which is externally supplied with write data, and produces internal write data, write drivers which amplify the internal write data sent from input buffer 22, and transmit the same to the selected memory cells, preamplifiers which amplify the data read from the selected memory cells, and an output buffer 20 which buffers and externally issues the data sent from the preamplifiers.

The preamplifiers and the write drivers are provided corresponding to memory array banks 14#0–14#3, respectively. In FIG. 1, each preamplifier and the corresponding write driver are depicted as a single block, and these blocks are represented by 18#0–18#3, respectively.

Input buffer 22 and output buffer 20 receive clock signal CLKQ from clock buffer 4, and externally transmit the data via terminals DQ0–DQ15 in synchronization with clock signal CLKQ.

Semiconductor memory device 1 further includes a power supply potential generating circuit 10 which receives a command signal COM from block 8, and thereby is activated to lower externally supplied power supply potential ext.Vdd and issue power supply potential Vdd to each block.

Power supply potential generating circuit 10 includes a Vref generating circuit 34 which issues a reference potential Vref forming a reference of internal power supply potential Vdd, a VDC control circuit 32 which issues control signal ICL, ICM and ICS in accordance with control signal COM, and a VDC 36 which lowers external power supply potential ext.Vdd to reference potential Vref, and thereby issues power supply potential Vdd.

Figure 2:
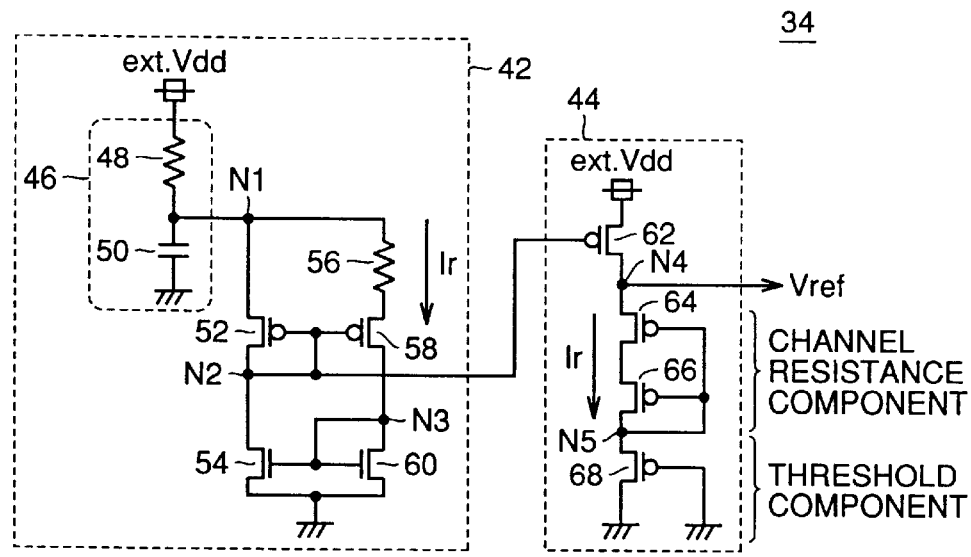
FIG. 2 is a circuit diagram showing a structure of a Vref generating circuit 34 in FIG. 1.

FIG. 2 is a circuit diagram showing a structure of a Vref generating circuit 34 in FIG. 1.

Referring to FIG. 2, Vref generating circuit 34 includes a constant power supply circuit 42, and a voltage output circuit 44 which issues reference potential Vref under the control of constant current supply circuit 42.

Constant current supply circuit 42 includes a low-pass filter 46 which receives and transmits the external power supply potential to a node N1 after removing noises, a P-channel MOS transistor 52 which has a source connected to node N1 as well as a gate and a drain connected to a node N2, an N-channel MOS transistor 54 which is connected between node N2 and the ground node, and has a gate connected to a node N3, a combination of a resistance 56 and a P-channel MOS transistor 58 which are connected in series between nodes N1 and N3, and an N-channel MOS transistor 60 which has a drain and a gate connected to node N3 as well as a source connected to the ground node. The gate of P-channel MOS transistor 58 is connected to node N2.

Low-pass filter 46 includes a resistance 48 which is connected between a node supplied with external power supply potential ext.Vdd and node N1, and a capacitor 50 which is connected between node N1 and the ground node.

Voltage output circuit 44 includes a P-channel MOS transistor 62 which is connected between a node supplied with external power supply potential ext.Vdd and a node N4, and has a gate connected to node N2, P-channel MOS transistors 64 and 66 which are connected in series between nodes N4 and N5, and have gates connected to node N5, and P-channel MOS transistor 68 which has a source connected to node N5 as well as a gate and a drain connected to the ground node.

Reference potential Vref is issued from node N4.

Figure 3:
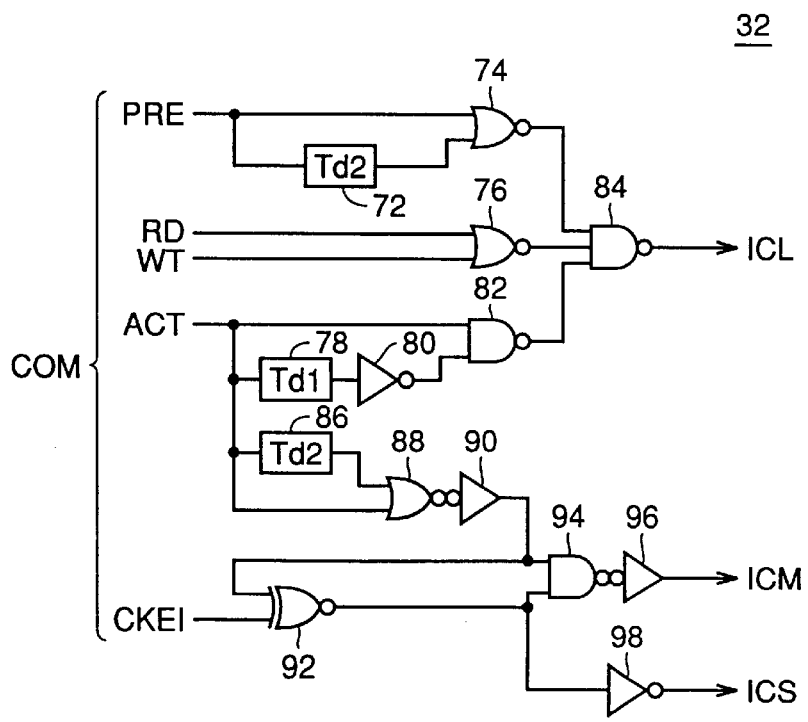
FIG. 3 is a circuit diagram showing a structure of a VDC control circuit 32 shown in FIG. 1.

FIG. 3 is a circuit diagram showing a structure of a VDC control circuit 32 shown in FIG. 1.

Referring to FIG. 3, VDC control circuit 32 receives command signal COM from block 8 shown in FIG. 1. Command signal COM includes signals PRE, RD, WT, ACT and CKEI.

VDC control circuit 32 includes a delay circuit 72 which delays signal PRE by a delay time Td2, an NOR circuit 74 which receives signal PRE and the output of delay circuit 72, an NOR circuit 76 which receives signals RD and WT, a delay circuit 78 which receives signal ACT, and delays it by a delay time Td1, an inverter 80 which receives and inverts the output of delay circuit 78, an NAND circuit 82 which receives signal ACT and the output of inverter 80, and an NAND circuit 84 which have three inputs for receiving the outputs of NOR circuits 74 and 76 and NAND circuit 82 respectively.

VDC control circuit 32 further includes a delay circuit 86 which receives signal ACT, and delays it by delay time Td2, an NOR circuit 88 which receives signal ACT and the output of delay circuit 86, an inverter 90 which receives and inverts the output of NOR circuit 88, an EXNOR circuit 92 which receives the output of inverter 90 and signal CKEI, an NAND circuit 94 which receives the outputs of inverter 90 and EXNOR circuit 92, an inverter 96 which receives and inverts the output of NAND circuit 94 for issuing signal ICM, and an inverter 98 which receives and inverts the output of EXNOR circuit 92 for issuing signal ICS.

Figure 4:
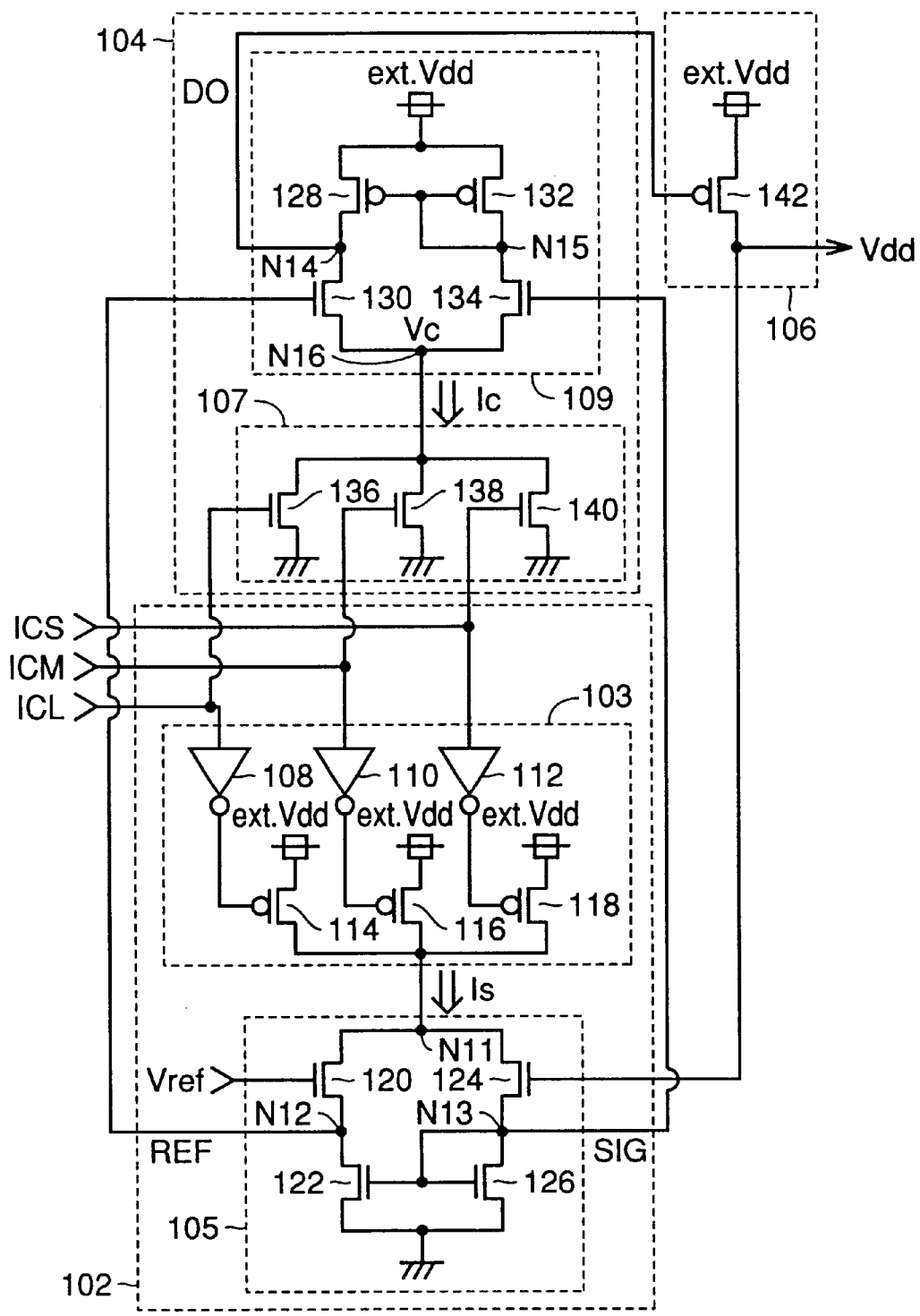
FIG. 4 is a circuit diagram showing a structure of a VDC 36 shown in FIG. 1.

FIG. 4 is a circuit diagram showing a structure of VDC 36 shown in FIG. 1.

Referring to FIG. 4, VDC circuit 36 includes a shifter circuit 102 which receives the potentials of reference potential Vref and internal power supply potential Vdd, and shifts the input levels, a comparator 104 which receives signals REF and SIG sent from the shifter circuit, and makes a comparison between them, and a driver 106 which operates in accordance with the output of comparator 104 to supply a current from a node supplied with external power supply potential ext.Vdd to a node issuing internal power supply potential Vdd.

Shifter circuit 102 includes a current setting portion 103 which sets through-current Is in accordance with signals ICL, ICM and ICS sent from VDC control circuit 32, and a level converting portion 105 which is driven by through-current Is to convert the levels of reference potential Vref and power supply potential Vdd.

Current setting portion 103 includes inverters 108, 110 and 112, which receive and invert signals ICL, ICM and ICS, respectively, and also includes P-channel MOS transistors 114, 116 and 118 which are connected in parallel between a node supplied with external power supply potential ext.Vdd and a node N11, and receive on their gates the outputs of inverters 108, 110 and 112, respectively.

Level converting portion 105 includes an N-channel MOS transistor 120 which is connected between nodes N11 and N12, and receives reference potential Vref on its gate, an N-channel MOS transistor 122 which is connected between node N12 and the ground node, and has a gate connected to a node N13, an N-channel MOS transistor 124 which is connected between nodes N11 and N13, and has a gate receiving internal power supply potential Vdd, and an N-channel MOS transistor 126 which has a gate and a drain connected to node N13, and also has a source connected to the ground node. Signal REF is issued from node N12 of shifter circuit 102, and signal SIG is issued from node N13.

Through-current Is is a sum of currents which flow through N-channel MOS transistors 120 and 124 having mutually connected drains in level converting portion 105, and is a drive current for operating level converting portion 105. In accordance with the value of through-current Is, the response speed of level converting portion 105 increases or decreases.

Comparator 104 includes a current setting portion 107 which sets through-current Ic in accordance with signals ICL, ICM and ICS, and a comparing portion 109 which is driven by through-current Ic, and makes a comparison between signals REF and SIG.

Comparing portion 109 includes a P-channel MOS transistor 128 which is connected between a node supplied with external power supply potential ext.Vdd and a node N14, and has a gate connected to a node N15, an N-channel MOS transistor 130 which is connected between nodes N14 and N16, and has a gate receiving signal REF, a P-channel MOS transistor 132 which has a source coupled to external power supply potential ext.Vdd and has a gate and a drain connected to node N15, and an N-channel MOS transistor 134 which is connected between nodes N15 and N16, and has a gate receiving signal SIG.

Current setting portion 107 includes N-channel MOS transistors 136, 138 and 140 which are connected in parallel between node N16 and the ground node, and receive signals on their gates, respectively.

Signal DO for controlling a current supplied by driver 106 is issued from node N14 of comparator 104.

Driver 106 includes a P-channel MOS transistor 142 which is connected between a node supplied with external power supply potential ext.Vdd and a node issuing internal power supply potential Vdd, and receives signal DO on its gate.

Through-current Ic is a sum of currents flowing through N-channel MOS transistors 130 and 134, which are paired with each other and form a differential amplifier circuit in comparing portion 109, and is a drive current which operates comparing portion 109. Depending on the value of through-current Ic, the response speed of comparing portion 109 increases or decreases.

An operation of the power supply generating circuit will now be described with reference to FIGS. 2 and 3.

First, description will be given on constant current supply circuit 42. It is assumed that P-channel MOS transistors 52 and 58 have channel widths of W1 and W2, respectively. These transistors are configured to have equal channel lengths and satisfy a relationship of W1<W2. When these are used in a subthreshold region, a potential difference dV occurs between the opposite ends of resistance 56. This potential difference dV is a difference between gate-source potentials Vgs of P-channel MOS transistors 52 and 58, and can be expressed by the following formula:

$$dV = k \times (T/q) \times \ln(W2/W1) \tag{5}$$

where k is a Boltzmann's factor, T is an absolute temperature and q represents a charge quantity of electrons. Since potential difference dV is applied across the opposite ends of resistance 56, current Ir flowing through resistance 56 can be expressed as Ir=dV/R, where R is a resistance value of resistance 56. Assuming that a temperature dependency of R can be ignored, current Ir is proportional to absolute value T. Thus, it has positive temperature characteristics.

P-channel MOS transistor 62 in voltage output circuit 44, having the same dimension that P-channel MOS transistor 52 in constant current supply circuit 42, forms a current mirror with respect to the constant current supply circuit, and current Ir is accurately mirrored. P-channel MOS transistors 64 and 66 have respective resistance components primarily formed of channel resistance components, and P-channel MOS transistor 68 has a resistance component primarily determined by the threshold. These will be referred to as the "channel resistance component" and the "threshold component", respectively. The channel resistance component has positive temperature characteristics inherited from current Ir.

By using the P-channel MOS transistor having a sufficiently large size, one of the threshold components exhibits the negative temperature characteristics corresponding to those of the threshold voltage. By employing the setting which attains a balance between them, it is possible to eliminate the temperature characteristics of reference potential Vref.

Alternatively, it may be determined that one of the components makes primary contribution, whereby it is possible to achieve the setting by which reference potential Vref exhibits the positive or negative temperature characteristics.

Figure 5:
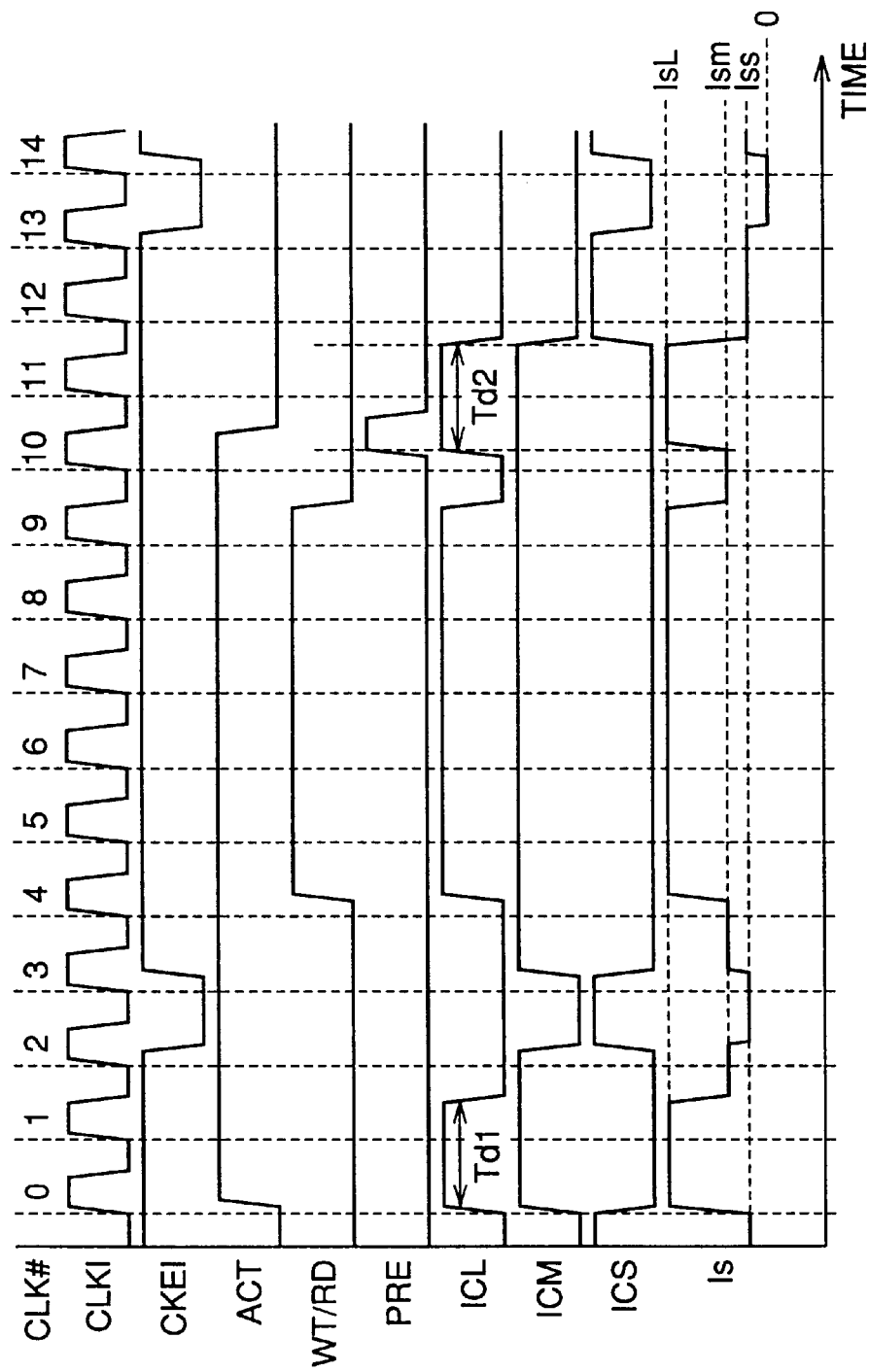
FIG. 5 is an operation waveform diagram showing an operation of a power supply potential generating circuit shown in FIG. 1.

FIG. 5 is an operation waveform diagram showing an operation of the power supply potential generating circuit shown in FIG. 1.

Referring to FIG. 5, signals ICL, ICM and ICS for controlling the through-current are issued in accordance with signals CKEI, ACT, WT/RD and PRE.

Assuming that P-channel MOS transistors 114, 116 and 118 arranged in the shifter for restricting the through-current have constants β of values of β114, β116 and β118, respectively, there is a relationship of β114>β116>β118, and through-current Is is determined depending on the active states of signals ICL, ICM and ICS.

Signal ACT represents a period for which the row-related circuits are active. Signal WT/RD represents a period for which column-related circuits are active. Signal PRE is a signal for deactivating the row-related circuits. Signal CKEI is prepared by taking in clock enable signal CKE which is externally supplied.

In clock cycle 0, signal ACT is activated. During delay time Td1 of delay circuit 78 after this activation, signal ICL is activated to attain H-level. Thereby, through-current Is of shifter circuit 102 shown in FIG. 4 takes on the value of IsL while signal ICL is active.

In clock cycle 2, signal CKEI attains L-level, whereby the clock buffer stops because it is not necessary to accept the clock signal even while the row-related circuits are active. Therefore, the current consumption is further reduced so that the performance required in VDC lowers. Accordingly, while signal CKEI is at L-level in clock cycle 2, only signal ICS among signals ICL, ICM and ICS attains H-level, and through-current Is takes on the value of Iss.

In clock cycle 4, when signal WT or RD representing the command for activating the column-related circuits is applied, both signals ICL and ICM attain H-level, and signal ICS attains L-level. In this operation, the through-current of the shifter takes on the value of IsL in accordance with the peak of consumption of the power supply current.

In clock cycle 10, signal PRE indicating deactivation of the row-related circuits is supplied. For a period equal to delay time Td2 of delay circuit 72 from the rising of signal PRE, signal ICL is kept at H-level. Thereby, through-current Is is set to IsL. For the row-related circuit active period other than the above, the power supply current consumption is relatively small so that only signal ICM attains H-level so that the through-current flows to a medium extent.

As described above, through-current Is of the shifter circuit is finely controlled in accordance with through-current Ic of the comparator based on appropriate internal signals, whereby the whole current consumption of the VDC can be optimized.

[Second Embodiment]

Figure 6:
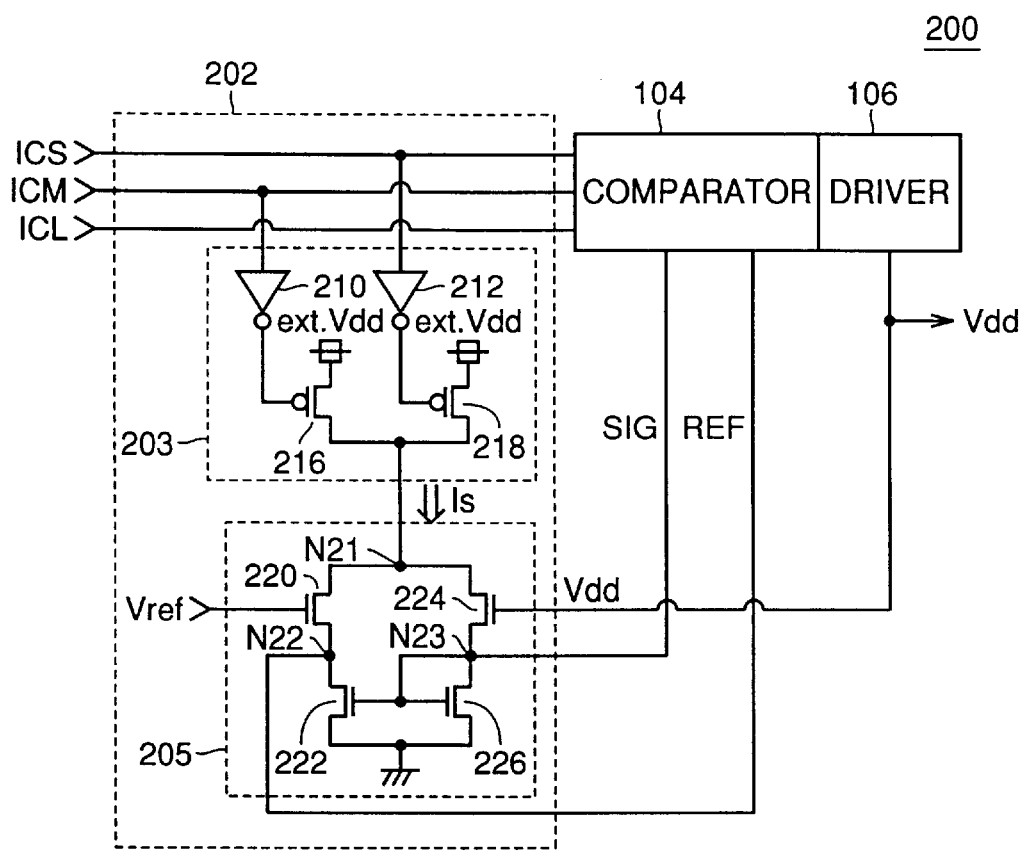
FIG. 6 is a circuit diagram showing a structure of a VDC 200 used in a second embodiment.

FIG. 6 is a circuit diagram showing a structure of a VDC 200 used in a second embodiment.

Referring to FIG. 6, VDC 200 differs from VDC 36 shown in FIG. 4 in that a shifter circuit 202 is employed instead of shifter circuit 102.

Shifter circuit 202 includes a current setting portion 203 which sets through-current Is in accordance with signals ICL, ICM and ICS, and a level converting portion 205 which is driven by through-current Is to convert the potential levels of reference potential Vref and internal power supply potential Vdd.

Current setting portion 203 includes an inverter 210 which receives and inverts signal ICM, an inverter 212 which receives and inverts signal ICS, a P-channel MOS transistor 216 which is connected between a node supplied with external power supply potential ext.Vdd and a node N21, and has a gate receiving the output of inverter 210, and a P-channel MOS transistor 218 which is connected between the node supplied with external power supply potential ext.Vdd and node N21, and has a gate receiving the output of inverter 212.

Level converting portion 205 includes an N-channel MOS transistor 220 which is connected between nodes N21 and N22, and has a gate receiving reference potential Vref, an N-channel MOS transistor 222 which is connected between node N22 and the ground node, and has a gate connected to a node N23, an N-channel MOS transistor 224 which is connected between nodes N21 and N23, and has a gate receiving internal power supply potential Vdd, and an N-channel MOS transistor 226 which has a gate and a drain connected to node N23, and has a source connected to the ground node.

Shifter circuit 202 issues signal REF from node N22, and issues signal SIG from node N23.

Structures other than the above are similar to those of VDC 36 shown in FIG. 4, and therefore will not be described.

In the first embodiment, through-current Ic of the comparator and through-current Is of the shifter circuit are controlled in the completely same manner. In some cases, however, it may be preferable that through-current Is of the shifter circuit is controlled in a manner different from that of through-current Ic of the comparator.

Inherently, through-current Is of the shifter circuit is relatively small. Through-current Ic of the comparator is small, for example, during the active standby period from clock cycle 2 to clock cycle 3 in FIG. 5, and during the standby period for which signal CKEI is at H-level as can be seen from clock cycle 12 to clock cycle 13. During standby for which signal CKEI is at H-level, however, the clock buffer is active so that the power supply current is consumed to a small but certain extent.

Only when through-current Ic of the comparator is suppressed, through-current Is of the shifter circuit becomes conspicuous.

In FIG. 5, there is a state in which signal ACT is at H-level, signal CKEI is at H-level and a command is not received. In this state, and in other word when only signal ICM is at H-level, the consumption of power supply circuit is not large. In this period, however, it is allowed to accept the command in the next cycle, and the power supply current may rapidly increase after one cycle.

For dealing with such rapid increase in power supply current, it is necessary to flow, in advance, through-current Is of the shifter circuit to a certain extent so that the delay time of the shifter circuit may not excessively increase the time required before start of operation of the VDC.

In many cases, it is not required to suppress the current during the above command acceptable period to a large extent. Accordingly, through-current Is of the shifter circuit can be controlled more roughly than through-current Ic of the comparator.

In the circuit shown in FIG. 6, through-current Is of the shifter circuit is determined by P-channel MOS transistors 216 and 218. P-channel MOS transistor 216 is turned on when signal ICL or ICM attains H-level, and P-channel MOS transistor 218 is turned on when signal ICS attains H-level.

As can be seen from the waveforms in FIG. 5, signal ICM is at H-level whenever signal ICL attains H-level. Therefore, on-off control of P-channel MOS transistor 216 is performed with reference to signal ICM.

Assuming that constants β of P-channel MOS transistors 216 and 218 are equal to β216 and β218, respectively, these are set to satisfy a relationship of β216>β218.

Owing to the above structure, when signal ICM is at H-level, P-channel MOS transistor 216 is turned on to maximize through-current Is of the shifter circuit.

When signal ICS is at H-level, P-channel MOS transistor 216 is turned off, and P-channel MOS transistor 218 is turned on for suppressing through-current Is of the shifter circuit.

In summary, while the consumption of power supply current is large or there is a possibility that the consumption of power supply current will rapidly increase after one clock cycle, through-current Is of the shifter circuit can be increased. While the consumption of power supply current is sufficiently small, it is possible to suppress through-current Is of the shifter circuit.

Figure 7:
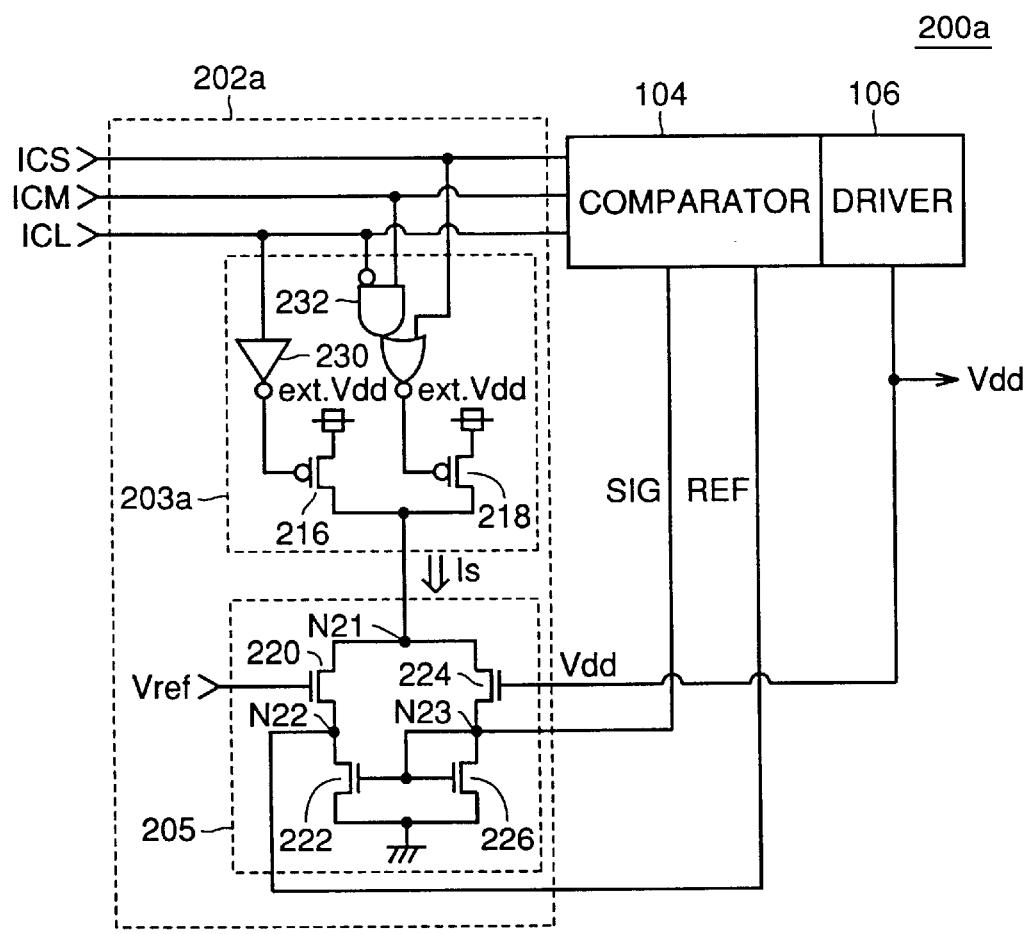
FIG. 7 is a circuit diagram showing a structure of a VDC 200a of a modification of the second embodiment.

FIG. 7 is a circuit diagram showing a structure of a VDC 200a which is a modification of the second embodiment.

Referring to FIG. 7, VDC 200a differs from VDC 200 shown in FIG. 6 in that a shifter circuit 202a is employed instead of shifter circuit 202.

Shifter circuit 200a includes a current setting portion 203a instead of current setting portion 203. Current setting portion 203a includes an inverter 230, which receives and inverts signal ICL for applying it to the gate of P-channel MOS transistor 216, instead of inverter 210, and also includes a gate circuit 232, which receives signals ICS, ICM and ICL, and applies an output corresponding to these received signals to P-channel MOS transistor 218, instead of inverter 212. The above structures are the difference of current setting portion 203a with respect to current setting portion 203 in FIG. 6.

Structures other than the above are the same as those of VDC 200 shown in FIG. 6, and therefore will not be described.

According to the circuit shown in FIG. 7, it is allowed to suppress through-current Is of the shifter circuit also in the case where signals ACT and CKEI in FIG. 5 are both at H-level and no command is supplied, and therefore in the case where signal ICL is at L-level and signal ICM is at H-level.

As described above, employment of the structure of the second embodiment achieves the semiconductor device, in which control of through-current Is of the shifter circuit is simplified, and the standby current during standby can be reduced.

[Third Embodiment]

According to the first and second embodiments, control of through-current Is is performed without changing the sizes of transistors forming the shifter circuit.

For example, in each of the structures of shifter circuits 102, 202 and 202a shown in FIGS. 4, 6 and 7, the voltage changes on the drain of P-channel MOS transistor interposed on the power supply side, and thereby through-current Is of the shifter circuit changes owing to effects such as a channel length modulation effect of the N-channel MOS transistor.

The above channel length modulation effect is such a phenomenon in an MOS transistor that an effective channel length changes depending on the drain voltage, and therefore the drain current changes.

As can be understood from formulas (1) and (2), the levels of signals SIG and REF do not change to a large extent as long as the N-channel MOS transistor operates within a saturated region and the channel length modulation effect controls through-current Is.

However, when through-current Is changes through a wide range, the N-channel MOS transistor forming the shifter circuit cannot operate in the saturated region, and the levels of signals SIG and REF may significantly change the states of signals ICL, ICM and ICS.

When the levels of signals SIG and REF significantly change, this affects the operation of the comparator. Therefore, if the range of variations of through-current Is is increased, the control itself of the through-current of VDC provided with the shifter circuit becomes difficult.

Figure 8:
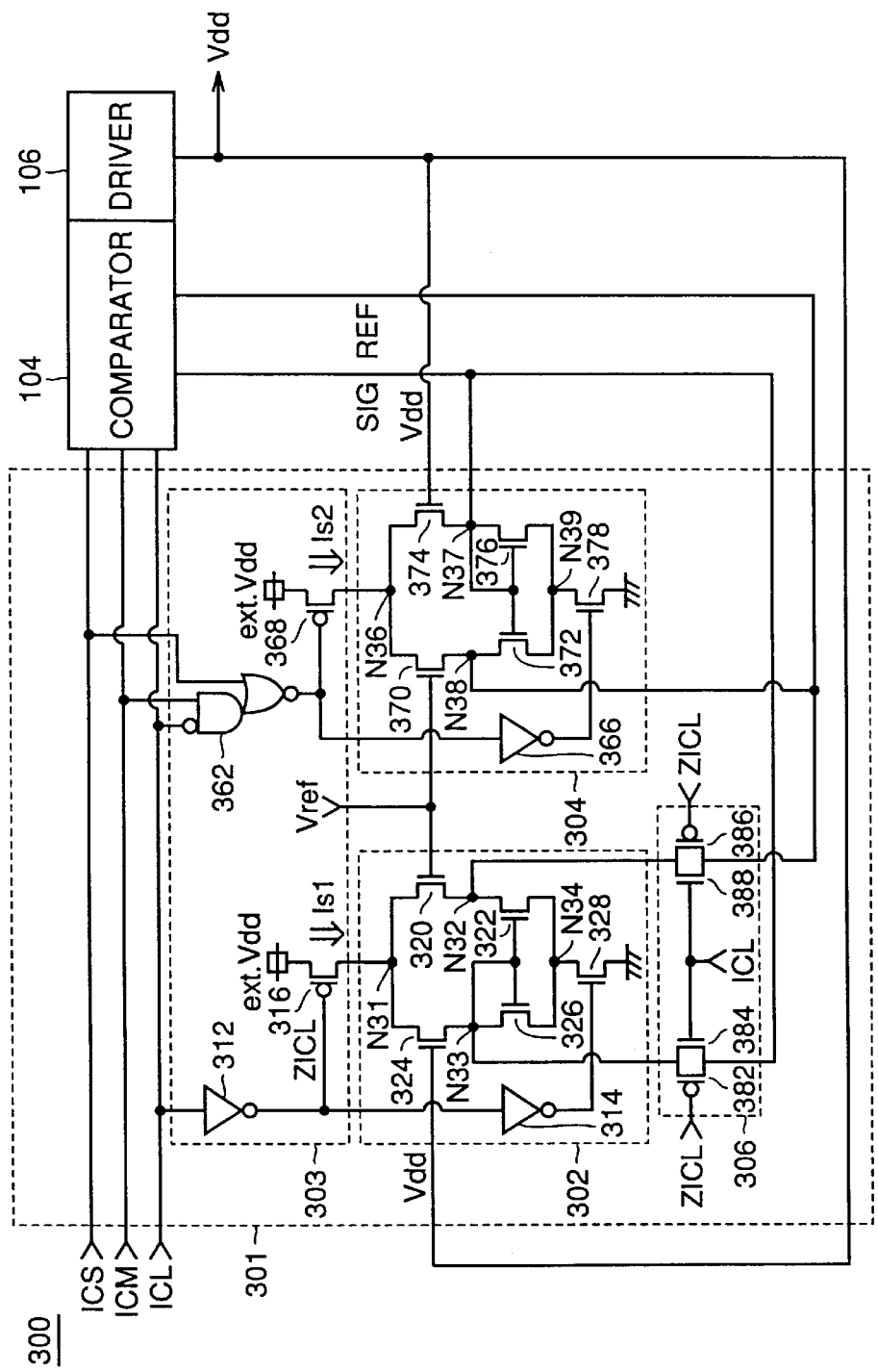
FIG. 8 is a circuit diagram showing a structure of a VDC 300 used in a third embodiment.

FIG. 8 is a circuit diagram showing a structure of a VDC 300 used in the third embodiment.

Referring to FIG. 8, VDC 300 differs from VDC 36 shown in FIG. 4 in that a shifter circuit 301 is employed instead of shifter circuit 102.

Shifter circuit 301 includes a current setting portion 303 which sets through-current Is in accordance with signals ICL, ICM and ICS, and level converting portions 302 and 304 which are driven by through-current Is to convert the potential levels of reference potential Vref and internal power supply potential Vdd, respectively.

Level converting portion 304 is provided corresponding to the case where the power supply current is not consumed to a large extent. Level converting portion 302 is provided corresponding to the case where the power supply current is consumed to a large extent.

Shifter circuit 301 further includes a switch circuit 306 for isolating the output of level converting portion 302 from signals SIG and REF when the consumption of power supply circuit is small.

Current setting portion 303 includes an inverter 312 which receives and inverts signal ICL, and a P-channel MOS transistor 316 which is connected between a node supplied with external power supply potential ext.Vdd and a node N31, and receives on its gate the output of inverter 312.

The current setting portion 303 further includes a gate circuit 362 which is operated by receiving signals ICL, ICM and ICS, and a P-channel MOS transistor 368 which is connected between a node supplied with external power supply potential ext.Vdd and a node N36, and receives on its gate the output of gate circuit 362.

Gate circuit 362 issues a value, which is based on the value of AND between the inverted value of signal ICL and signal ICM as well as signal ICS, and more specifically, is determined by NOR between the value of the above AND and signal ICS.

Level converting portion 302 includes an inverter 314 which receives and inverts the output of inverter 312, an N-channel MOS transistor 320 which is arranged between nodes N31 and N32, and receives reference potential Vref on its gate, an N-channel MOS transistor 324 which is arranged between nodes N31 and N32, and receives internal power supply potential Vdd on its gate, an N-channel MOS transistor 322 which is arranged between nodes N32 and N34, and has a gate connected to node N33, an N-channel MOS transistor 326 which has a gate and a drain connected to node N33, and also has a source connected to node N34, and an N-channel MOS transistor 328 which is connected between node N34 and the ground node, and receives the output of inverter 314 on its gate.

Level converting portion 304 includes an inverter 366 which receives and inverts the output of gate circuit 362, an N-channel MOS transistor 370 which is connected between nodes N36 and N38, and receives reference potential Vref on its gate, an N-channel MOS transistor 372 which is arranged between nodes N38 and N39, and has a gate connected to a node N37, an N-channel MOS transistor 374 which is arranged between nodes N36 and N37, and receives internal power supply potential Vdd on its gate, an N-channel MOS transistor 376 which has a gate and a drain connected to node N37, and also has a source connected to a node N39, and an N-channel MOS transistor 378 which is connected between node N39 and the ground node, and receives the output of inverter 366 on its gate.

Switch circuit 306 includes N-channel MOS transistors 384 and 382 which are connected in parallel between nodes N33 and N37, and receive signals ICL and ZICL on their gates, respectively, and also includes an N-channel MOS transistor 388 and a P-channel MOS transistor 386 which are connected in parallel between nodes N32 and N38, and receive signals ICL and ZICL on their gates, respectively. Signal ZICL is an inverted signal of signal ICL.

Signal REF is issued from node N38 of shifter circuit 301 to comparator 104, and signal SIG is issued from node N37 to comparator 104. Comparator 104 and driver 106 have structures similar to those shown in FIG. 4, and therefore will not be described.

In the third embodiment, a plurality of shifters are prepared corresponding to through-currents Is of the shifter to be set, and switching among these shifters is performed in accordance with the states of signals ICL, ICM and ICS.

Assuming that level converting portions 302 and 304 have through-currents Is1 and Is2, respectively, through-current Is1 is larger than through-current Is2. Each shifter uses the transistors of sizes suitable to through-current Is.

If level converting portion 302 is activated while signal ICL in FIG. 5 is at H-level and therefore the consumption of power supply current is large, the consumption of power supply current rapidly increases. Even in this case, the shifter circuit can rapidly respond to it by converting variations in internal power supply potential Vdd into signals SIG and REF.

During standby, level converting portion 302 is deactivated, and level converting portion 304 is activated. Since the through-current of shifter circuit 301 is suppressed to Is2, the current consumption of the whole VDC can be reduced.

Assuming that N-channel MOS transistors 322 and 376 have constants $\beta$ of values of $\beta 322$ and $\beta 376$, respectively, the relationship expressed by the following formula is present between the respective through-currents and constants $\beta$.

$$Is1/\beta 322 = Is2/\beta 376 \qquad (6)$$

In this case, the outputs of shifter circuits 302 and 304 are equal to each other. These shifter circuits are controlled not to be activated simultaneously, and are configured to prevent interference between the output of the inactive shifter circuit and the output of the active shifter circuit.

Through-current Ic of the comparator is expressed by the formula (4) if potential Vc on node N16 in FIG. 4 is substantially equal to the ground voltage. Since $Is/\beta$ in the two shifter circuits are constant, it can be understood that through-current Ic of the comparator is constant even if through-current Is of the shifter circuit changes.

Since a disadvantageous correspondence is not present between through-current Is of the shifter circuit and through-current Ic of the comparator as described above, through-current Ic of the comparator can be controlled by performing switching among N-channel MOS transistors 136, 138 and 140 in FIG. 4 independently of through-current Is of the shifter circuit.

Since the third embodiment is provided with the plurality of level converting portions in contrast to the first and second embodiments, it requires a larger layout area of the shifter circuit portion. In VDC shown in FIG. 8, however, the area of the shifter circuit is small, compared with the areas of the comparator and the driver portion. Therefore, increase in layout area caused by one level converting portion is relatively small.

According to the third embodiment, as described above, the plurality of level converting portions are prepared in the shifter circuit, and the level converting portion to be activated is selected in accordance with the state whereby the level of the output of the shifter circuit can always be kept within a desired range. In addition to this, since through-current Ic of the comparator and through-current Is of the shifter circuit can be controlled completely independently of each other, the current control in the whole VDC can be performed more flexibly.

[Fourth Embodiment]

In the third embodiment described above, the plurality of level converting portions are prepared in accordance with the values of through-currents Is of the shifter circuits to be set. These level converting portions are set to provide the equal output levels.

In FIG. 8, level converting portion 304 which is active during standby may be configured to cause an imbalance between the value of constant $\beta$ of N-channel MOS transistor 374 receiving internal power supply potential Vdd and the value of constant $\beta$ of N-channel MOS transistor 370 receiving reference potential Vref. In this case, the level of internal power supply potential Vdd which is set during the standby period shifts from reference potential Vref.

By positively utilizing this, constant $\beta$ of N-channel MOS transistor 374 is set to the value slightly smaller than the value of constant $\beta$ of N-channel MOS transistor 370.

Thereby, internal power supply potential Vdd is kept slightly higher than reference potential Vref while level converting portion 304 is active.

For example, it is now assumed that signals ACT and CKEI in FIG. 5 are both at H-level, and no command is received. Thus, it is assumed that only signal ICM is at H-level. During the period of the above state, it is unclear when the operation of activating the column-related circuits or deactivating the row-related circuits is performed, and therefore when the operation increasing the power supply current is performed. When such operations start, the VDC cannot respond sufficiently quickly even if through-current Is of the shifter circuit is increased. Therefore, the internal power supply potential may instantaneously lower to an unpreferable level for internal circuits.

If the internal power supply potential is set to a slightly high value during the period preceding the period for which the consumption of power supply current increases as described above, the excessive lowering of the internal power supply potential can be prevented because a large amount of electric charges are accumulated owing to the decouple capacity.

Conversely, the value of constant β of N-channel MOS transistor 374 may be set to be slightly larger than the value of constant β of N-channel MOS transistor 370. In this case, internal power supply potential Vdd is kept slightly lower than reference potential Vref while level converting portion 304 is active.

For example, during a period of clock cycles 2–3 in FIG. 5, and in other words, while signal ACT is at H-level and signal CKEI is at L-level, the row-related circuits in a certain bank is already activated but are on standby with a low current consumption. In this state, the next operation is allowed only after a wait cycle according to the general DRAM standards.

In this period, therefore, the low power consumption can be achieved by setting internal power supply potential Vdd to a low value.

From the above, the level converting portion, which is activated during standby, among the plurality of level converting portions is set such that the VDC issues internal power supply potential Vdd shifted from reference potential Vref, whereby it is possible to prevent lowering of internal power supply potential Vdd, which may be caused by the next operation, and it is also possible to achieve the low current consumption during the active standby period, in which signal CKE is at L-level.

[Fifth Embodiment]

Figure 9:
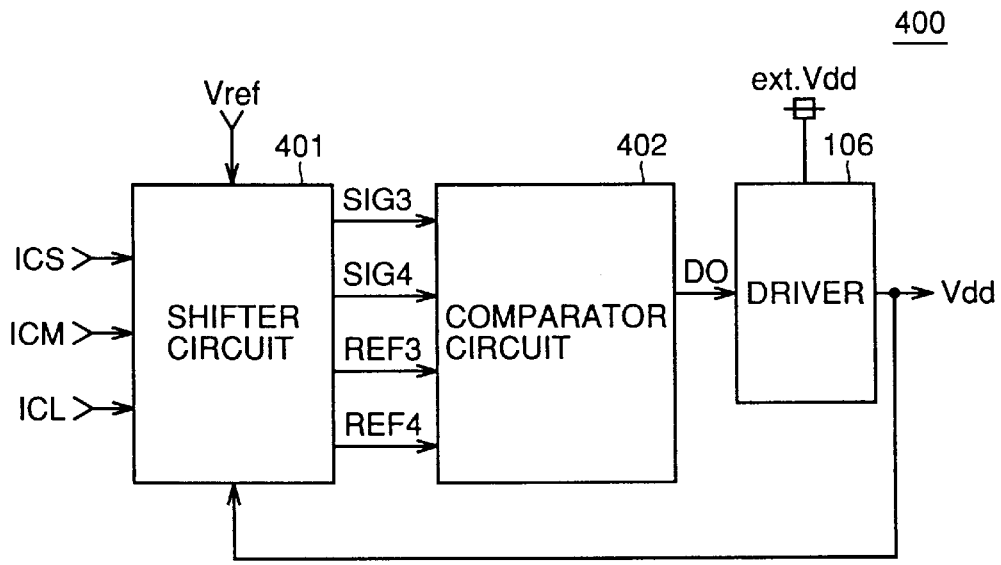
FIG. 9 is a block diagram showing a structure of a VDC 400 of a fifth embodiment.

FIG. 9 is a block diagram showing a structure of a VDC 400 of a fifth embodiment.

Referring to FIG. 9, VDC 400 includes a shifter circuit 401 which has a through-current Is controlled by signals ICS, ICM and ICL, and issues signals SIG3, SIG4, REF3 and REF4 by shifting the levels of reference potential Vref and internal power supply potential Vdd, a comparator circuit 402 which receives signals SIG3, SIG4, REF3 and REF4, and issues signal DO to the driver, and driver 106 which supplies a current from a node, which is supplied with external power supply potential ext.Vdd, to a node issuing internal power supply potential Vdd in accordance with signal DO. The structure of driver 106 is similar to that of the driver in VDC 36 shown in FIG. 4, and therefore will not be described.

In VDC 400, shifter circuit 401 receives control signals ICS, ICM and ICS. Comparator circuit 402 does not receive control signals ICS, ICM and ICS. Comparator circuit 402 controls its through-current Ic in accordance with the output signal sent from the shifter circuit.

Figure 10:
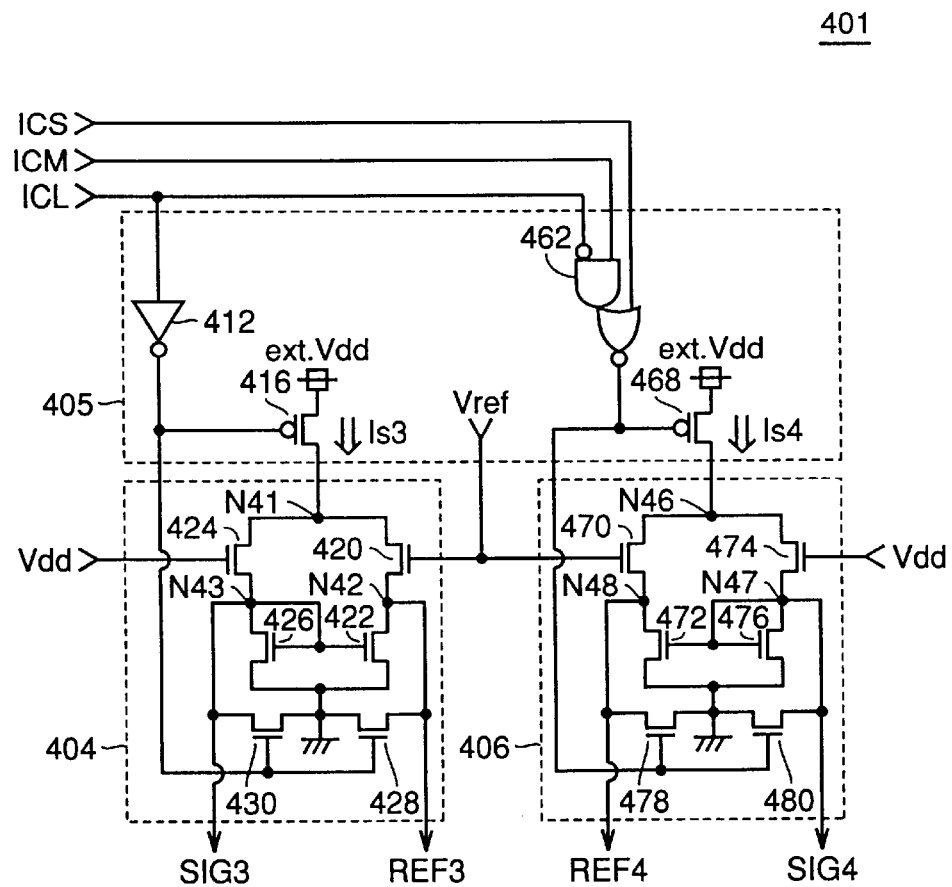
FIG. 10 is a circuit diagram showing a structure of a shifter circuit 401 in FIG. 9.

FIG. 10 is a circuit diagram showing a structure of shifter circuit 401 shown in FIG. 9.

In FIG. 10, shifter circuit 401 includes a current setting portion 405 which sets the through-current of the shifter circuit in accordance with signals ICL, ICM and ICS, a shifter circuit 404 which is provided corresponding to a large through-current Is3, and a shifter circuit 406 which is provided corresponding to a small through-current Is4 corresponding to the standby period.

The current setting portion 405 includes an inverter 412 which receives and inverts signal ICL, and a P-channel MOS transistor 416 which is connected between a node supplied with external power supply potential ext.Vdd and node N41, and receives on its gate the output of inverter 412.

Current setting portion 405 further includes a gate circuit 462 which is operated by receiving signals ICL, ICM and ICS, and a P-channel MOS transistor 468 which receives on its gate the output of gate circuit 462, and is connected between the node supplied with external power supply potential ext.Vdd and a node N46.

Gate circuit 462 issues a value which is based on the value of AND between the inverted value of signal ICL and signal ICM as well as signal ICS, and more specifically is obtained by NOR between the above value of AND and the value of signal ICS.

Shifter circuit 404 includes an N-channel MOS transistor 420 which is connected between nodes N41 and N42, and receives reference potential Vref on its gate, an N-channel MOS transistor 422 which is connected between node N42 and the ground node, and has a gate connected to a node N43, an N-channel MOS transistor 424 which is connected between nodes N41 and N43, and receives internal power supply potential Vdd on its gate, and an N-channel MOS transistor 426 which has a gate and a drain connected to node N43, and has a source connected to the ground node.

Shifter circuit 404 further includes an N-channel MOS transistor 430 which is connected between node N43 and the ground node, and has a gate receiving the output of inverter 412, and an N-channel MOS transistor 428 which is connected between node N42 and the ground node, and has a gate receiving the output of inverter 412.

Signal REF3 is issued from node N42, and signal SIG3 is issued from node N43.

Shifter circuit 406 includes an N-channel MOS transistor 470 which is connected between nodes N46 and N48, and receives reference potential Vref on its gate, an N-channel MOS transistor 472 which is connected between nodes N48 and the ground node, and has a gate connected to a node N47, an N-channel MOS transistor 474 which is connected between nodes N46 and N47, and receives internal power supply potential Vdd on its gate, and an N-channel MOS transistor 476 which has a gate and a drain connected to node N47, and has a source connected to the ground node.

Shifter circuit 406 further includes an N-channel MOS transistor 480 which is connected between node N47 and the ground node, and receives on it gate the output of gate circuit 462, and an N-channel MOS transistor 478 which is connected between node N48 and the ground node, and receives on its gate the output of gate circuit 462.

Signal SIG4 is issued from node N47, and signal REF4 is issued from node N48.

Figure 11:
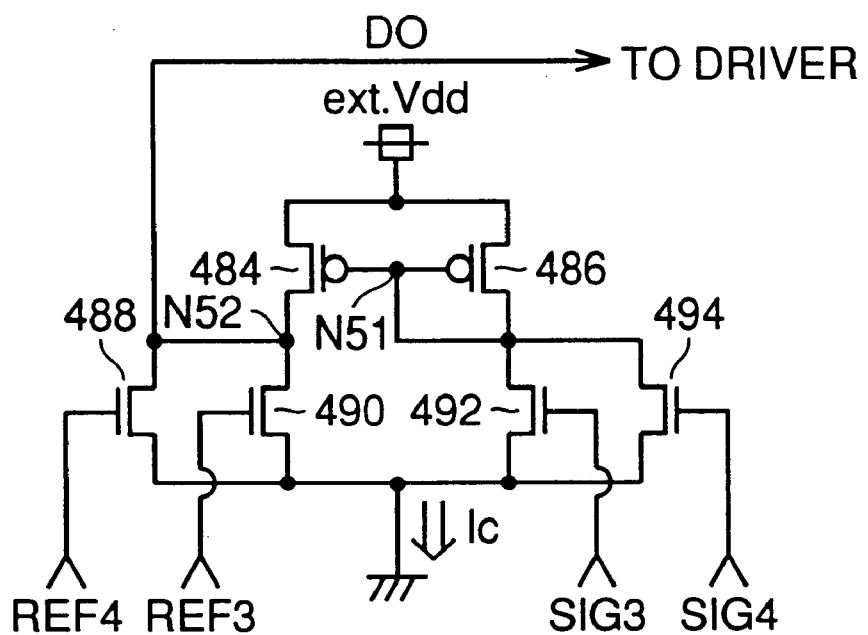
FIG. 11 is a circuit diagram showing a structure of a comparator circuit 402 in FIG. 9.
Figure 12:
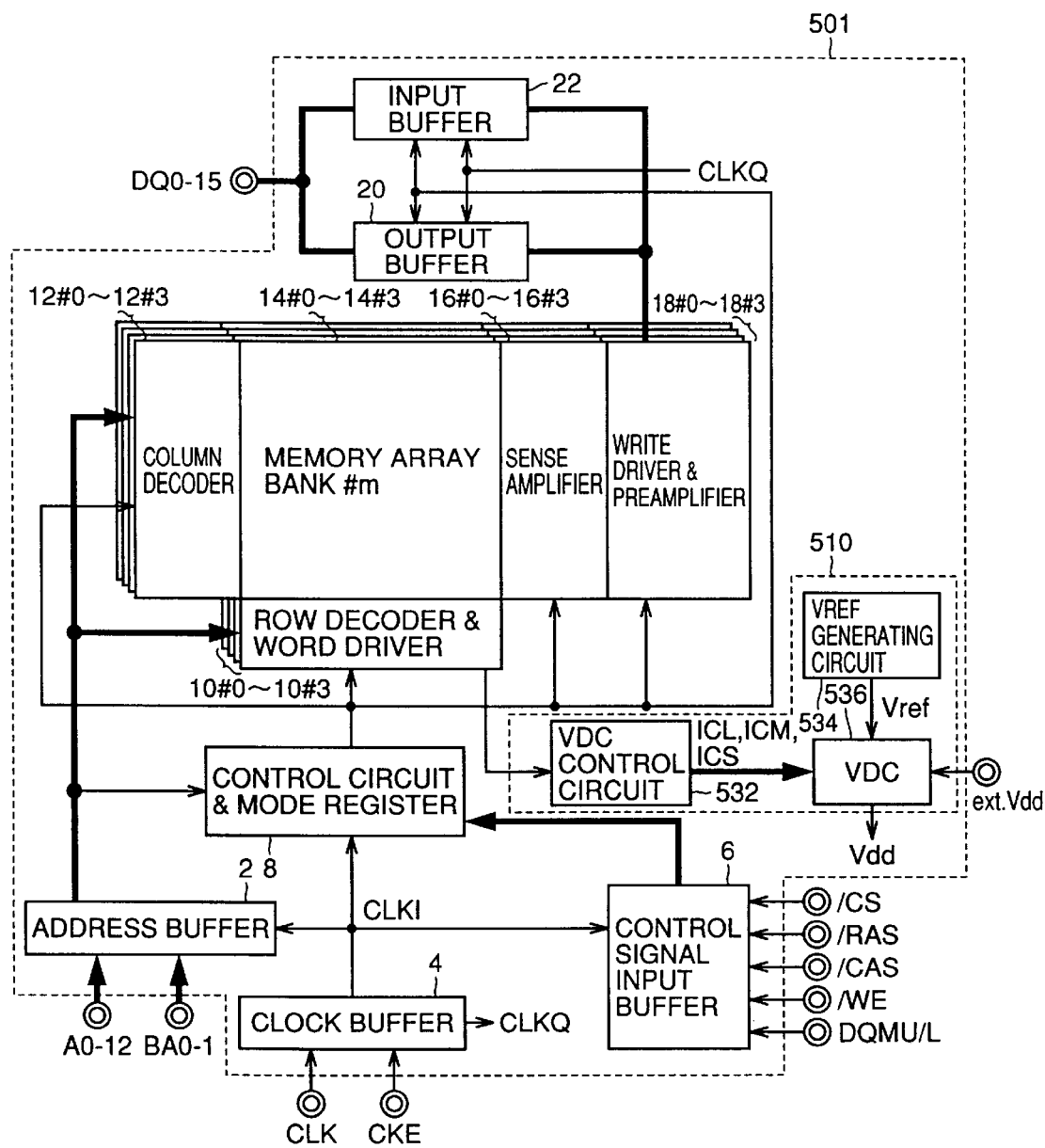
FIG. 12 is a block diagram showing a structure of an SDRAM 501 of an example of a conventional semiconductor chip.
Figure 13:
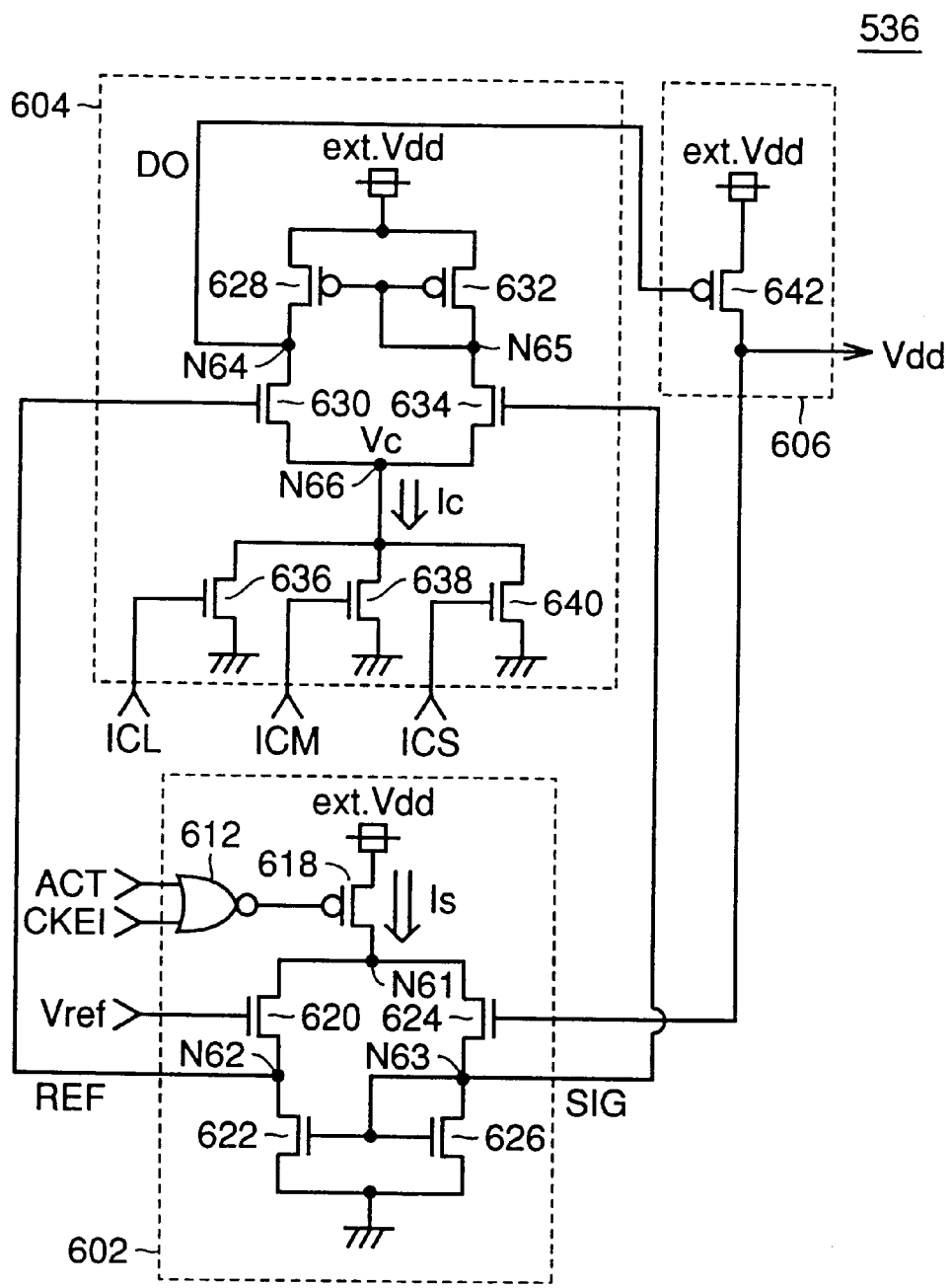
FIG. 13 is a circuit diagram showing a structure of a VDC 536 shown in FIG. 12.
Figure 14:
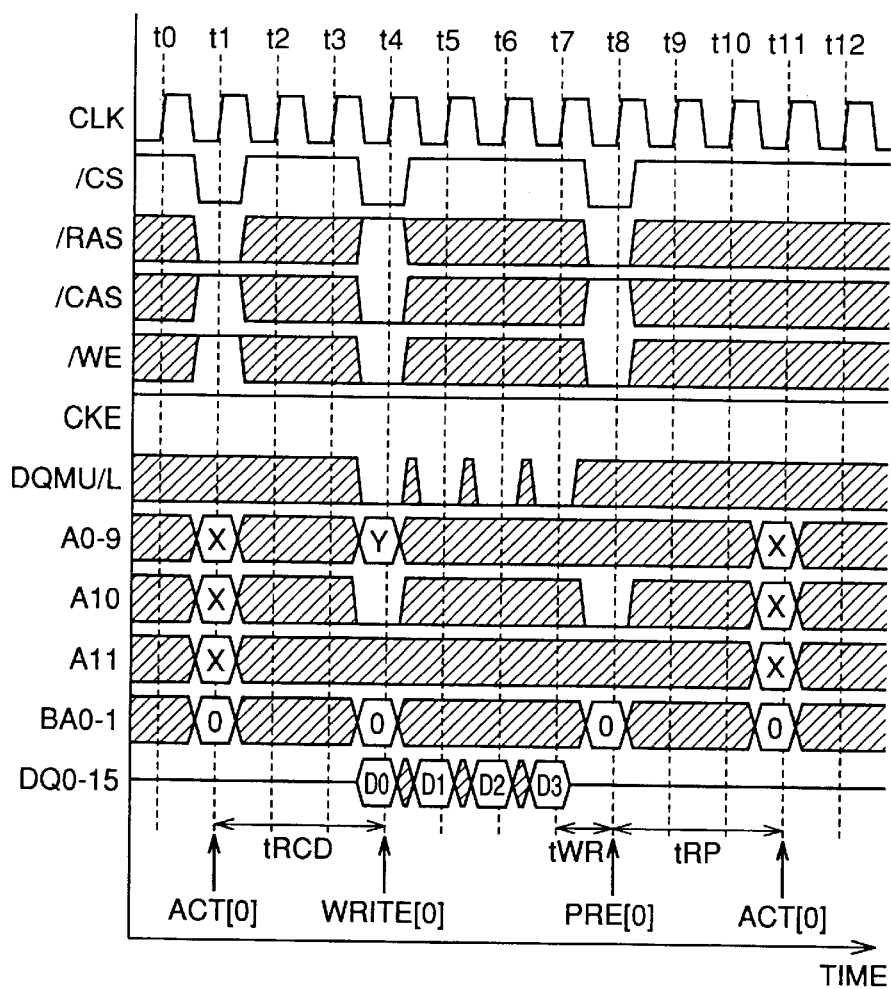
FIG. 14 is an operation waveform diagram showing external signal waveforms in a write operation of the SDRAM.
Figure 15:
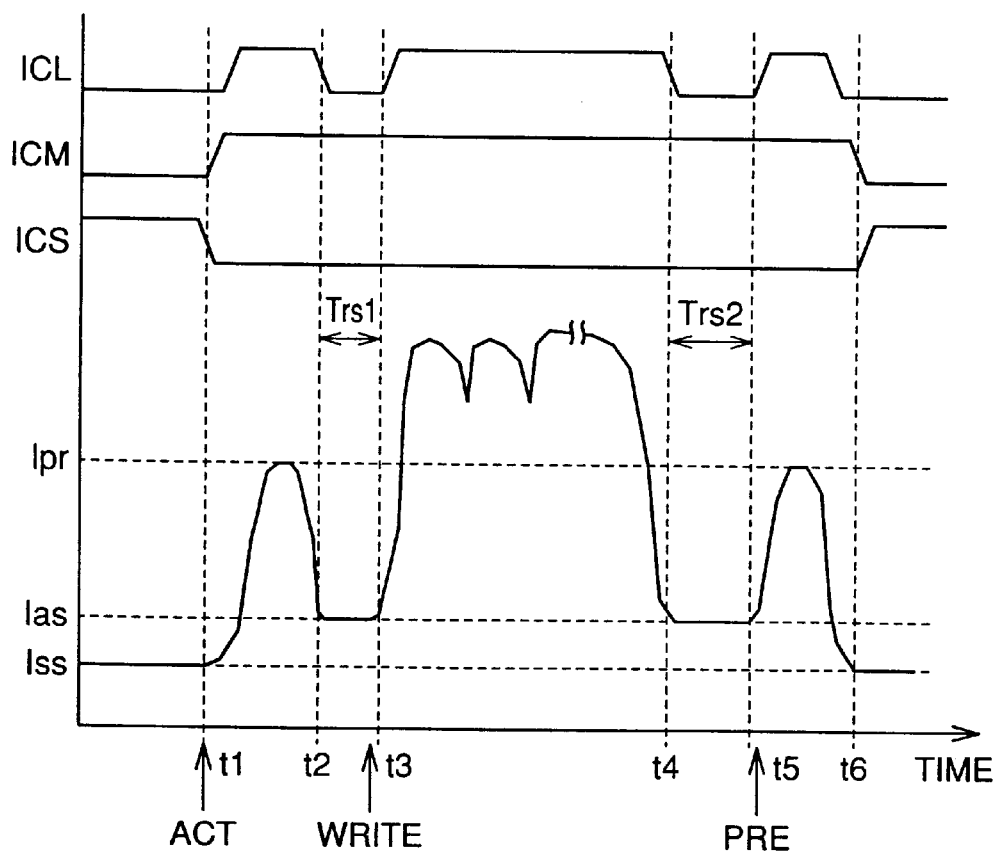
FIG. 15 is a schematic waveform diagram showing changes in current consumption with time.

FIG. 11 is a circuit diagram showing a structure of comparator circuit 402 in FIG. 9.

Referring to FIG. 11, comparator circuit 402 has a P-channel MOS transistor 484 which is connected between a node supplied with external power supply potential ext.Vdd and a node N52, and has a gate connected to a node N51, a P-channel MOS transistor 486 which has a gate and a drain connected to node N51, and has a source coupled to external power supply potential ext.Vdd, N-channel MOS transistors 488 and 490 which are connected in parallel between a node N52 and the ground node, and receive signals REF4 and REF3 on their gates, respectively, and N-channel MOS transistors 492 and 494 which are connected in parallel between node N51 and the ground node, and receive signals SIG3 and SIG4 on their gates, respectively.

Referring to FIG. 10 again, shifter circuit 401 includes shifter circuits 404 and 406 which are set to provide large and small through-current Is3 and Is4 corresponding to necessary through-currents Is, respectively. Each of shifter circuits 404 and 406 is formed of N-channel MOS transistors having transistor sizes corresponding to through-current Is.

Assuming that N-channel MOS transistors 422 and 476 have constants β of values of β422 and β476, the relationship expressed by the following formula is present between the through-currents and the constants β of the transistors:

$$Is3/\beta422 = Is4/\beta476 = Is0 \tag{7}$$

The two shifter circuits are not activated at the same time, and the output of the inactive shifter circuit is fixed to the ground potential by the outputs of inverter 412 and gate circuit 462.

The comparator circuit shown in FIG. 11 has N-channel MOS transistors 492, 494, 490 and 488 which receive signals SIG3, SIG4, REF3 and REF4, respectively. N-channel MOS transistors 492 and 490 have constants β of the same value, and N-channel MOS transistors 494 and 488 likewise have constants β of the same value.

Although a transistor for restricting the current is not interposed between the source of each of N-channel MOS transistors 488–494 and the ground node, N-channel MOS transistors 488–494 can sufficiently operate in the saturated region without employing especial configurations for floating the source potentials, if the level of generated internal power supply potential Vdd is low.

Naturally, the transistor for current restriction may be interposed between the source of each of N-channel MOS transistors 488–494 and the ground node. If such transistors are interposed, the gates thereof may be coupled to a fixed potential for the most simple structure.

An operation of VDC 400 will now be described.

For example, while signal ICL is at H-level in the structure shown in FIGS. 10 and 11, shifter circuit 404 is activated to issue signals SIG3 and REF3. At the same time, signals SIG4 and REF4 are fixed to the ground voltage.

In comparator 402, only N-channel MOS transistors 492 and 490 which receive signals SIG3 and REF3, respectively, are turned on. It is assumed that N-channel MOS transistor 492 has constant β of a value of β492. In this state, through-current Ic takes on the value of β492×Is0.

While signal ICS is at H-level, shifter circuit 406 is activated to issue signals SIG4 and REF4. In this case, signals SIG3 and REF3 are fixed to the ground potential. In comparator circuit 402, therefore, only N-channel MOS transistors 494 and 488 which receive signals SIG4 and REF4, respectively, are turned on. It is assumed that N-channel MOS transistor 494 has constant β of a value of β494. In this case, through-current Ic of the comparator is equal to (β494×Is0).

By appropriately determining this constant β, it is possible to control through-current Ic of the comparator circuit to be constant times as large as through-current Is of the shifter circuit.

In the VDC provided with the shifter circuit, as described above, through-current Ic of the comparator can be controlled merely by controlling the current of the shifter circuit so that through-current Ic of the comparator may correspond to the controlled current of the shifter circuit, and the control can be performed in a unified manner. Thereby, the circuit can have a simplified structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising
    a power supply circuit receiving an external power supply potential, supplying a power supply current to a load circuit connected to an internal power supply node, and controlling an amount of said power supply current at a response speed corresponding to externally applied setting such that the potential on said internal power supply node is held at a constant potential, said power supply circuit including
    a reference potential generating circuit for generating a reference potential used as a reference value of said constant potential,
    a control circuit for receiving said setting,
    a level shifter circuit for shifting levels of the potential on said internal power supply node and said reference potential into predetermined potential ranges at a response speed corresponding to the output of said control circuit, and outputting the level-shifted potentials,
    a first drive circuit operating in accordance with the level-shifted potentials, and
    a second drive circuit for receiving said external power supply potential, and supplying said power supply current of the amount corresponding to an output of said first drive circuit to said internal power supply node.

2. The semiconductor device according to claim 1, wherein
    said level shifter circuit includes:
    a first current setting portion for issuing a first drive current of an amount corresponding to the output of said control circuit, and
    a first level converting portion for receiving said first drive current as an operation power supply current, and converting the levels of the potential on said internal power supply node and said reference potential at the response speed of said level shifter circuit determined by said first drive current.

3. The semiconductor device according to claim 2, wherein
    said first level converting portion issues a first signal corresponding to the potential on said internal power supply node, and a second signal attaining the same level as said first signal when the potential on said internal power supply node is equal to said reference potential, and changing in opposite direction with respect to said first signal when the potential on said internal power supply node is not equal to said reference potential; and
    said first drive circuit has a comparing portion for making a comparison between said first and second signals, and driving said second drive circuit in accordance with the result of the comparison.

4. The semiconductor device according to claim 3, wherein
said first drive circuit further has a second current setting portion for issuing a second drive current in accordance with the output of said control circuit, and
said comparing portion makes the comparison between said first and second signals at a speed corresponding to said second drive current.

5. The semiconductor device according to claim 4, wherein
said first current setting portion has first and second MOS transistors connected in parallel,
said first drive current includes a sum of the currents flowing through said first and second MOS transistors,
said second current setting portion includes third and fourth MOS transistors connected in parallel,
said second drive current includes a sum of the currents flowing through said third and fourth MOS transistors, and
said control circuit controls active states of said first and second MOS transistors in response to said setting, activates said third MOS transistor in accordance with the state of said first MOS transistor, and activates said fourth MOS transistor in accordance with the state of said second MOS transistor.

6. The semiconductor device according to claim 2, wherein
said control circuit issues first and second control signals for determining said first drive current;
said first current setting portion includes:
a first MOS transistor being activated in response to said first control signal, and
a second MOS transistor arranged in parallel with said first MOS transistor, and being activated in response to said second control signal; and
said first drive current includes a sum of the currents flowing through said first and second MOS transistors.

7. The semiconductor device according to claim 2, wherein
said control circuit activates a first control signal in an operation mode of said load circuit achieved with the large power supply current, and activating a second control signal in a standby mode of said load circuit achieved with the small power supply current;
said first current setting portion includes:
a first MOS transistor being turned on in response to activation of said first control signal, and
a second MOS transistor responding to activation of said second control signal by being turned on to flow therethrough a current smaller than that of said first MOS transistor;
said first level converting portion includes:
a second level converting portion receiving, as an operation power supply current, a first current from said first MOS transistor, having a third MOS transistor, and converting the levels of the potential on said internal power supply node and said reference potential in predetermined potential ranges for issuing the level-converted potentials, respectively,
a third level converting portion receiving, as an operation power supply current, a second current from said second MOS transistor, having a fourth MOS transistor, and converting the levels of the potential on said internal power supply node and said reference potential in predetermined potential ranges for issuing the level-converted potentials, respectively, and
a switch circuit for transmitting the output of said second level converting portion to an output node of said first level converting portion in accordance with activation of said first control signal; and
said first drive current includes a sum of said first and second currents.

8. The semiconductor device according to claim 7, wherein
said fourth MOS transistor receives on its gate said reference potential,
said third level converting portion further includes a fifth MOS transistor having a gate connected to said internal power supply node, and
said fifth MOS transistor has a smaller drive performance than said fourth MOS transistor.

9. The semiconductor device according to claim 7, wherein
said fourth MOS transistor receives on its gate said reference potential,
said third level converting portion further includes a fifth MOS transistor having a gate connected to said internal power supply node, and
said fifth MOS transistor has a larger drive performance than said fourth MOS transistor.

10. The semiconductor device according to claim 2, wherein
said control circuit activates a first control signal in an operation mode of said load circuit achieved with the large power supply current, and activating a second control signal in a standby mode of said load circuit achieved with the small power supply current;
said first current setting portion includes:
a first MOS transistor being turned on in response to activation of said first control signal, and
a second MOS transistor responding to activation of said second control signal by being turned on to flow therethrough a current smaller than that of said first MOS transistor;
said first level converting portion includes:
a second level converting portion receiving, as an operation power supply current, a first current from said first MOS transistor, having a third MOS transistor, and issuing first and second signals complementary to each other, and
a third level converting portion receiving, as an operation power supply current, a second current from said second MOS transistor, having a fourth MOS transistor, and issuing third and fourth signals complementary to each other; and
said first drive circuit includes:
fifth and sixth MOS transistors receiving on their gates said first and second signals, respectively, and
seventh and eighth MOS transistors having smaller drive performances than said fifth and sixth MOS transistors, and receiving on their gates said third and fourth signals, respectively.

* * * * *

UNITED STATES PATENT AND TRADEMARK OFFICE
CERTIFICATE OF CORRECTION

PATENT NO. : 6,320,810 B1
DATED : November 20, 2001
INVENTOR(S) : Takashi Kono et al.

Page 1 of 1

It is certified that error appears in the above-identified patent and that said Letters Patent is hereby corrected as shown below:

<u>Title page,</u>
Item [73], Assignee, change "Mitsubishiki Denki Kabushiki Kaisha" to -- Mitsubishi Denki Kabushiki Kaisha --

Signed and Sealed this

Thirtieth Day of April, 2002

Attest:

JAMES E. ROGAN
*Director of the United States Patent and Trademark Office*

*Attesting Officer*